(12) United States Patent  
Botula et al.

(10) Patent No.: US 8,912,597 B2  
(45) Date of Patent: Dec. 16, 2014

(54) SEMICONDUCTOR DEVICE INCLUDING ASYMMETRIC LIGHTLY DOPED DRAIN (LDD) REGION, RELATED METHOD AND DESIGN STRUCTURE

(71) Applicant: International Business Machines Corporation, Armonk, NY (US)

(72) Inventors: Alan B. Botula, Essex Junction, VT (US); Robert M. Rassel, Colchester, VT (US); Yun Shi, South Burlington, VT (US); Mark E. Stidham, Bloomington, IN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/946,362

(22) Filed: Jul. 19, 2013

(65) Prior Publication Data

US 2013/0299903 A1 Nov. 14, 2013

Related U.S. Application Data

(62) Division of application No. 12/963,054, filed on Dec. 8, 2010, now Pat. No. 8,518,782.

(51) Int. Cl.
*H01L 29/78* (2006.01)
*H01L 21/265* (2006.01)
*H01L 29/66* (2006.01)

(52) U.S. Cl.
CPC ........ *H01L 29/7833* (2013.01); *H01L 29/7835* (2013.01); *H01L 21/26586* (2013.01); *H01L 29/66659* (2013.01)
USPC ........................................ 257/336

(58) Field of Classification Search
USPC ........................................ 438/286
See application file for complete search history.

(56) References Cited

U.S. PATENT DOCUMENTS

| | | |
|---|---|---|
| 4,177,095 A | 12/1979 | Nelson |
| 4,450,021 A | 5/1984 | Batra et al. |
| 4,473,941 A | 10/1984 | Turi et al. |
| 4,511,413 A | 4/1985 | Tuttle et al. |
| 4,758,537 A | 7/1988 | Jennings |
| 4,771,011 A | 9/1988 | Hemmah et al. |
| 5,869,882 A | 2/1999 | Chen et al. |
| 5,882,967 A | 3/1999 | Brown et al. |
| 6,083,794 A * | 7/2000 | Hook et al. ............. 438/286 |
| 6,291,325 B1 | 9/2001 | Hsu |
| 6,566,204 B1 | 5/2003 | Wang et al. |
| 6,586,317 B1 | 7/2003 | Vashchenko et al. |
| 7,560,784 B2 | 7/2009 | Cheng et al. |

(Continued)

OTHER PUBLICATIONS

U.S. Appl. No. 12/963,054, Notice of Allowance and Fees Due dated Apr. 22, 2013.

*Primary Examiner* — Stephen W Smoot
(74) *Attorney, Agent, or Firm* — Anthony J. Canale; Hoffman Warnick LLC

(57) ABSTRACT

A semiconductor device is disclosed. The semiconductor device includes a semiconductor substrate including a first source drain region, a second source drain region, and an intrinsic region therebetween; an asymmetric lightly doped drain (LDD) region within the substrate, wherein the asymmetric LDD region extends from the first source drain region into the intrinsic region between the first source drain region and the second source drain region; and a gate positioned atop the semiconductor substrate, wherein an outer edge of the gate overlaps the second source drain region. A related method and design structure are also disclosed.

10 Claims, 10 Drawing Sheets

(56) References Cited

U.S. PATENT DOCUMENTS

| | | |
|---|---|---|
| 7,605,428 B2 | 10/2009 | Williams et al. |
| 2001/0013628 A1 | 8/2001 | Tyagi et al. |
| 2006/0152644 A1 | 7/2006 | Yi |
| 2009/0011528 A1 | 1/2009 | Lee et al. |
| 2009/0325355 A1 | 12/2009 | Poock et al. |
| 2010/0109059 A1* | 5/2010 | Nakamura ............. 257/290 |

* cited by examiner

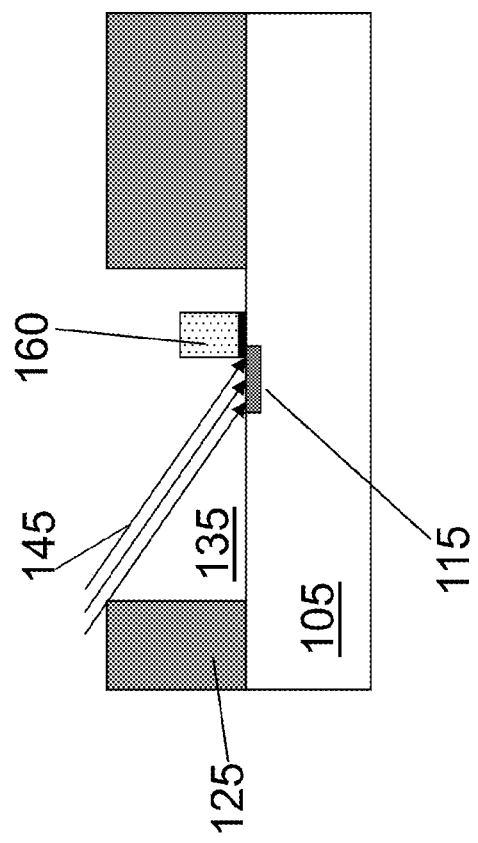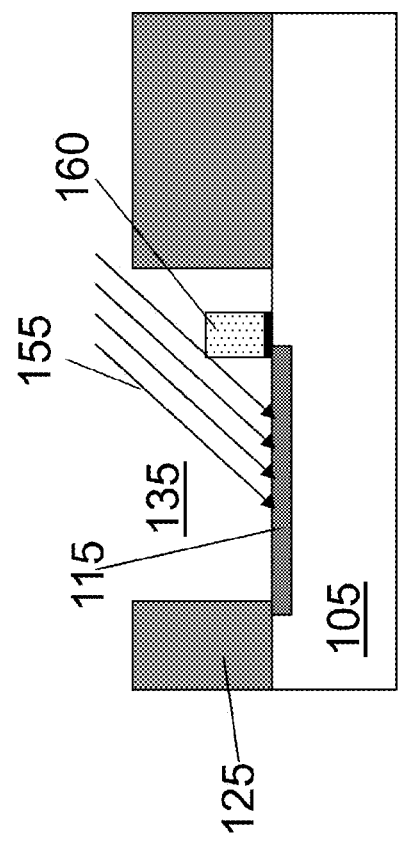

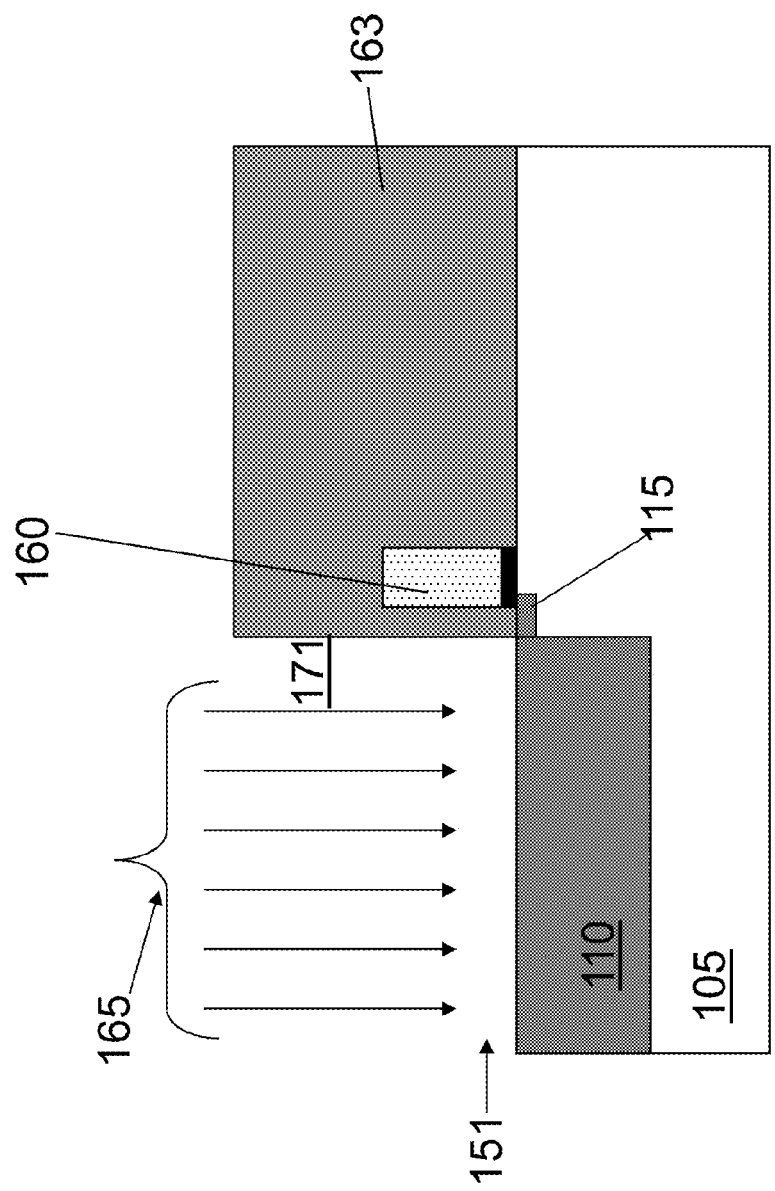

US 8,912,597 B2

SEMICONDUCTOR DEVICE INCLUDING ASYMMETRIC LIGHTLY DOPED DRAIN (LDD) REGION, RELATED METHOD AND DESIGN STRUCTURE

CROSS-REFERENCE TO RELATED APPLICATIONS

This application is a divisional of U.S. Pat. No. 8,518,782, which received a Notice of Allowance on Apr. 22, 2013, and is incorporated by reference herein in its entirety.

TECHNICAL FIELD

Embodiments of this disclosure relate generally to semiconductor devices and, more particularly, to a semiconductor device including an asymmetric lightly doped drain (LDD) region, a related method and design structure.

BACKGROUND

Typically, in semiconductor devices, zener diodes are used in a voltage clamping circuit to protect the device during high voltage switching. The function of a zener diode can be implemented by stacking field-effect transistors (FETs). Unfortunately, the size of this circuitry is much larger than the FETs that are protected. Also, conventional zener diode designs are not compatible with the FET layout.

BRIEF SUMMARY

A first aspect of the disclosure provides a semiconductor device comprising: a semiconductor substrate including a first source drain region, a second source drain region, and an intrinsic region therebetween; an asymmetric lightly doped drain (LDD) region within the substrate, wherein the asymmetric LDD region extends from the first source drain region into the intrinsic region between the first source drain region and the second source drain region; and a gate positioned atop the semiconductor substrate, wherein an outer edge of the gate overlaps the second source drain region.

A second aspect of the disclosure provides a method of forming a semiconductor device, the method comprising: providing a gate atop a semiconductor substrate; forming a photoresist over the gate and semiconductor structure; forming an asymmetrical opening through the photoresist around the gate; forming an asymmetric lightly doped drain (LDD) region within the semiconductor substrate with a first angled ion implant and a second angled ion implant; forming a first source drain region within the substrate on a first side of the gate with a first vertical ion implant; and forming a second source drain region within the substrate on a second side of the gate with a second vertical ion implant, such that the asymmetric LDD region extends from the first source drain region into an intrinsic region between the first source drain region and the second source drain region and an outer edge of the gate overlaps the second source drain region.

A third aspect of the disclosure provides a design structure tangibly embodied in a machine readable medium for design, manufacturing, or testing a semiconductor device, the design structure comprising: a semiconductor substrate including a first source drain region, a second source drain region, and an intrinsic region therebetween; an asymmetric lightly doped drain (LDD) region within the substrate, wherein the asymmetric LDD region extends from the first source drain region into the intrinsic region between the first source drain region and the second source drain region; and a gate positioned atop the semiconductor substrate, wherein an outer edge of the gate overlaps the second source drain region.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

FIGS. 3-9 show a method of forming a semiconductor device according to embodiments of the invention.

Figure 1:
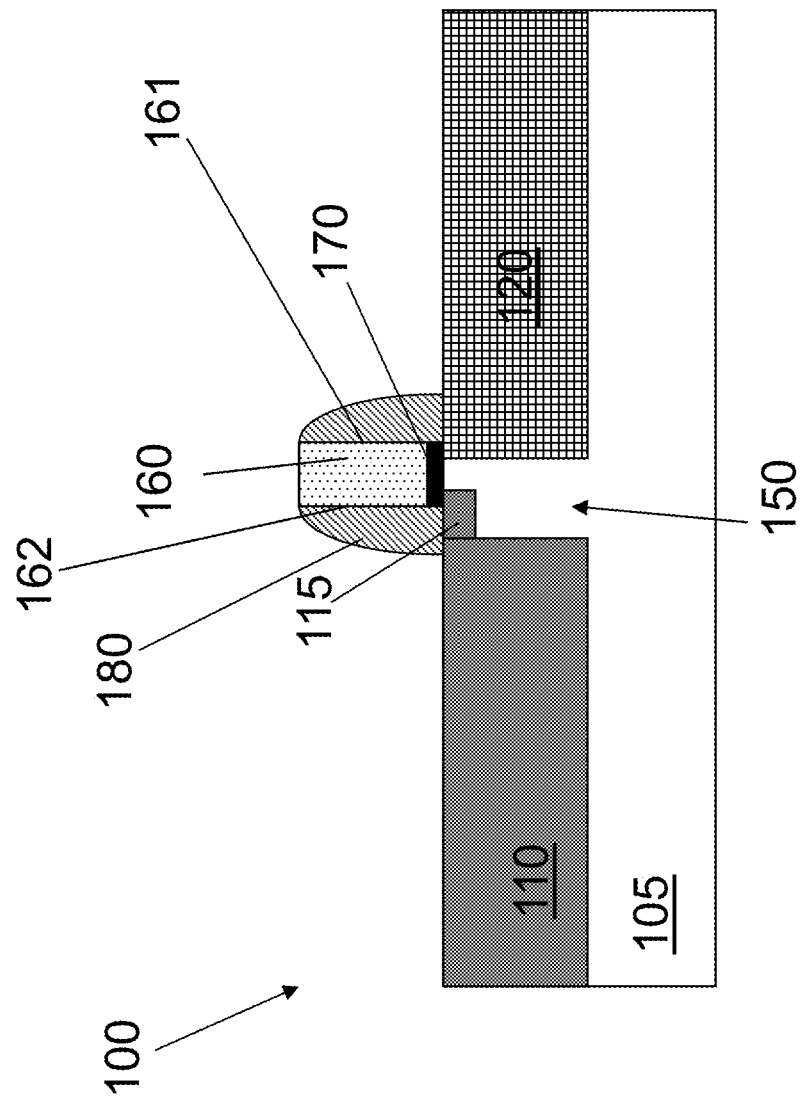
FIG. 1 shows a semiconductor device according to an embodiment of the invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

FIG. 1 shows a semiconductor device 100 according to an embodiment of this invention. Semiconductor device 100 may include a semiconductor substrate 105. Semiconductor substrate 105 may include a first source drain region 110, a second source drain region 120, and an intrinsic region 150 between first source drain region 110 and second source drain region 120. Semiconductor device 100 may also include an asymmetric lightly doped drain (LDD) region 115 within semiconductor substrate 105 that extends from first source drain region 110 into intrinsic region 150 between first source drain region 110 and second source drain region 120. Asymmetric LDD region 115 also may not extend to second source drain region 120, such that intrinsic region 150 is between asymmetric LDD region 115 and second source drain region 120. A gate 160 may be positioned atop semiconductor substrate 105. A first outer edge 161 of gate 160 may overlap second source drain region 120. This overlap forms a breakdown region and, therefore, semiconductor device 100 may be a lateral zener diode that is FET-compatible. The breakdown voltage of this lateral FET-compatible zener diode may be scalable by the amount of overlap of first outer edge 161 of gate 160 over second source drain region 120. A second outer edge 162 of gate 160 does not overlap first source drain region 110. Second outer edge 162 of gate 160 may overlap asymmetric LDD region 115.

As further seen in FIG. 1, semiconductor device 100 may also include gate dielectric 170 between semiconductor substrate 105 and gate 160. Spacer structures 180 may also be provided on either side of gate 160.

It is understood that when discussing p-type and n-type doping herein, the polarities can be reversed from what is disclosed. For example, for an NFET process flow, first source drain region 110 may be N-type doped and second source drain region 120 may be P-type doped. In this case, asymmetric LDD region 115 would be N-type doped. For a PFET process flow, first source drain region 110 may be P-type doped and second source drain region 120 may be N-type doped. Asymmetric LDD region 115 would be P-type doped for the PFET process.

Figure 2:
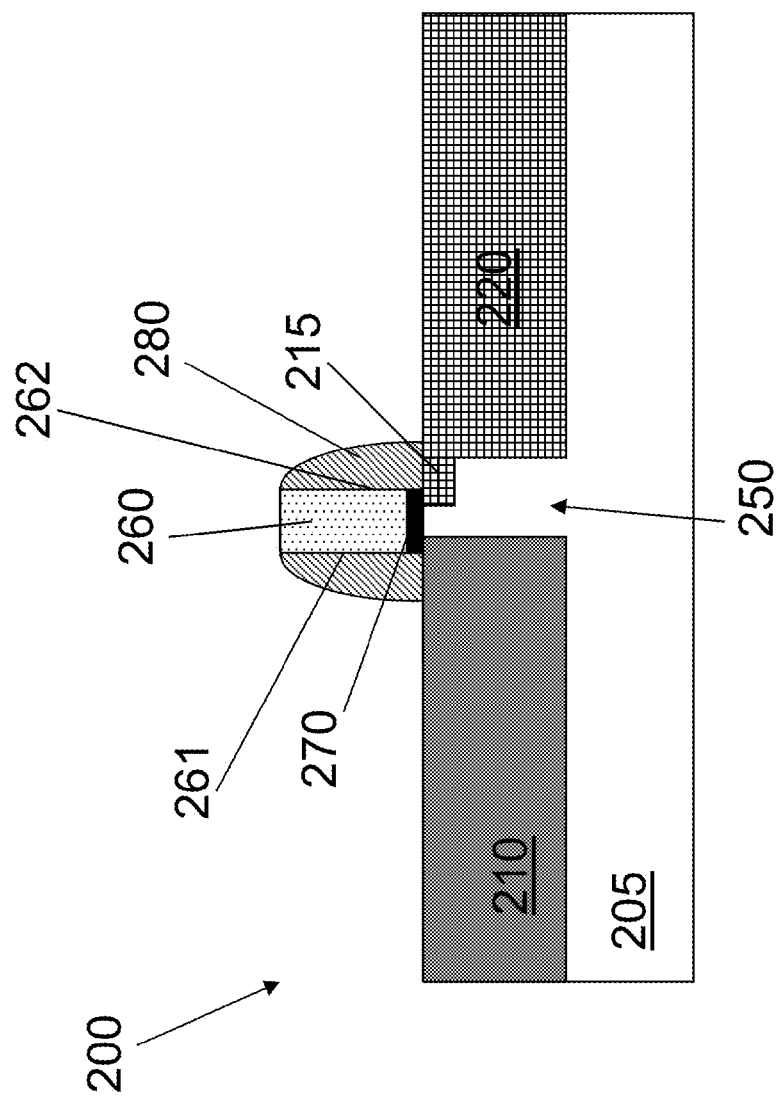
FIG. 2 shows a semiconductor device according to an embodiment of the invention.

It is also understood that while first source drain region 110 is on the left side and second source drain region 120 is on the right side in FIG. 1, this configuration may be reversed, as seen in FIG. 2. Here, semiconductor device 200 may include first source drain region 220 on the right side and second source drain region 210 on the left side. In this embodiment, asymmetric LDD region 215 may still extend from first source drain region 210 into intrinsic region 250. Similar to the embodiment shown in FIG. 1, asymmetric LDD region 215 may not extend to second source drain region 210, such that intrinsic region 250 is between asymmetric LDD region 215 and second source drain region 210. Further, first outer edge 261 of gate 260 may overlap second source drain region 210 to form a breakdown region. Second outer edge 262 of gate 260 does not overlap first source drain region 220. Second outer edge 262 of gate 260 may overlap asymmetric LDD region 215.

FIGS. 3-10 show a method of forming semiconductor device 100 according to an embodiment of the invention. Although FIGS. 3-10 only show the method of forming semiconductor device 100 in FIG. 1, it is understood that a similar method may be employed to form semiconductor device 200 of FIG. 2

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Figure 3:
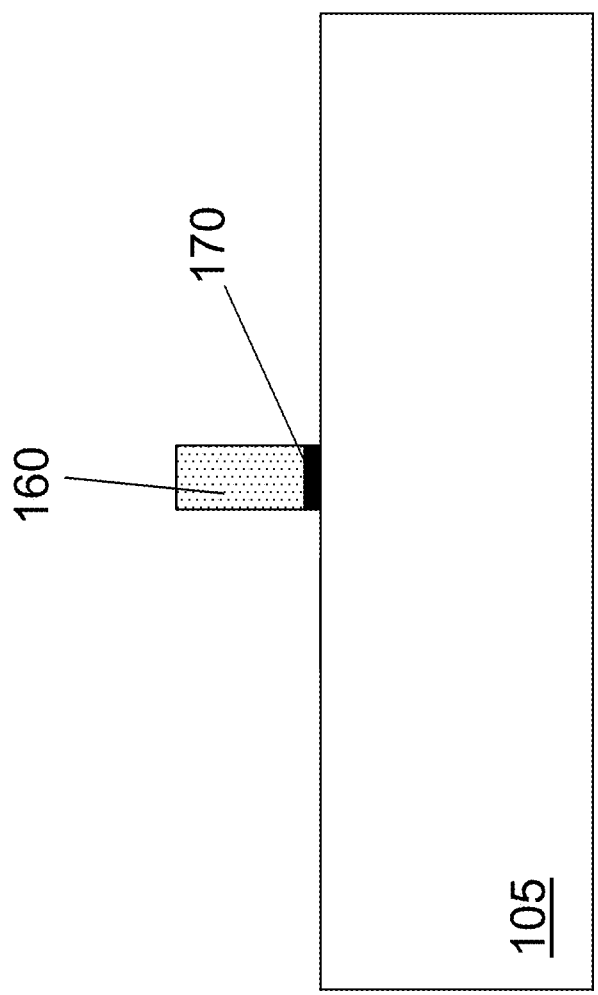

Turning to FIG. 3, gate 160 is provided atop semiconductor substrate 105. Substrate 105 can comprise any commonly used substrate material including but not limited to: silicon, germanium, silicon germanium, silicon carbide, and silicon on insulator. Gate 160 can comprise any commonly used gate material including but not limited to polysilicon or high melting point refractory metals, such as W, Ti, Ta, Mo, Nb, Re, Ru and their binary or ternary metallic derivatives, e.g. WN, TiN, TaN, MoN, MoO2, TaSiN. Further, gate dielectric 170 may be deposited between gate 160 and semiconductor substrate 105. Gate dielectric 170 may comprise any commonly used gate dielectric material including but not limited to oxide, nitride, oxynitride, and high-k materials such as hafnium silicate, zirconium silicate, hafnium dioxide, and zirconium dioxide.

Figure 4:
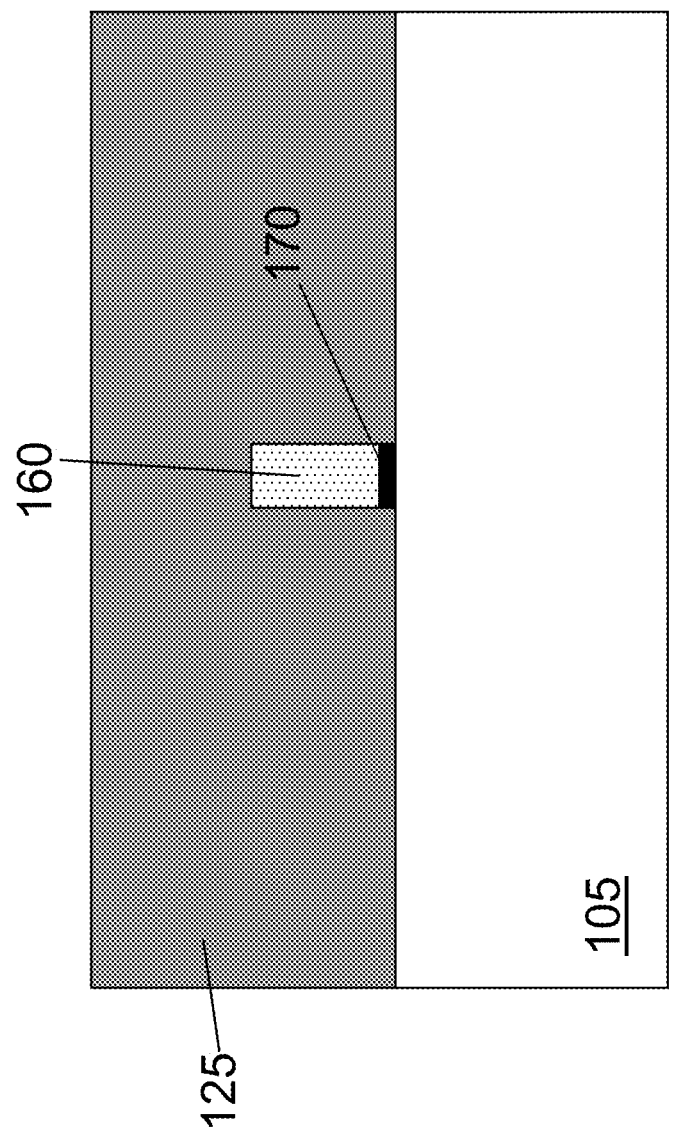
Figure 5:
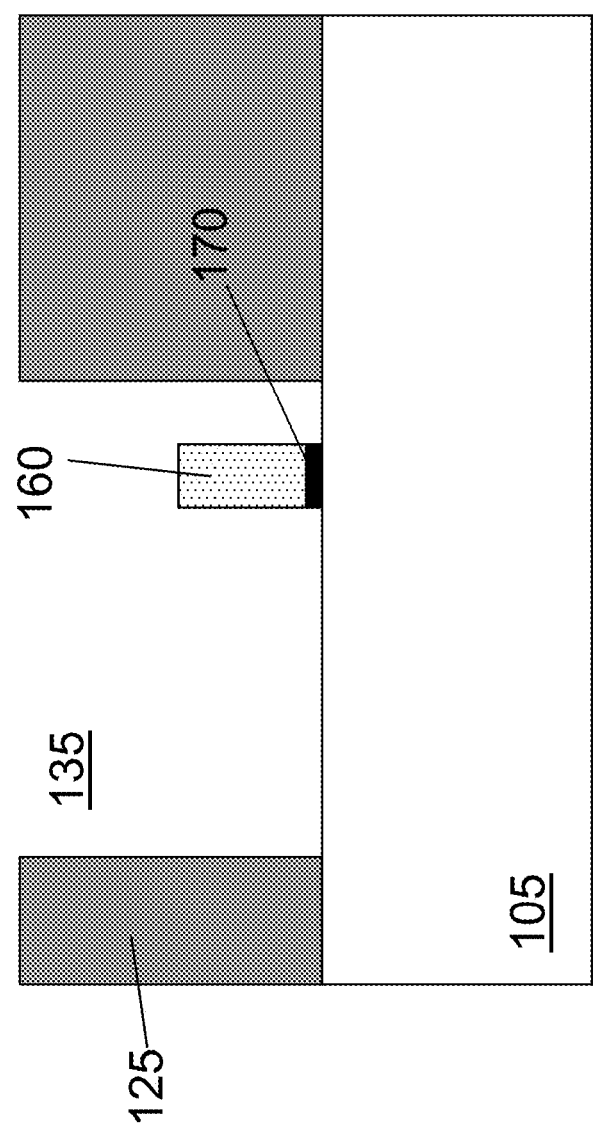

Next, as seen in FIG. 4, a photoresist layer 125 may be formed over gate 160 and semiconductor substrate 105. An asymmetrical opening 135 may be formed through photoresist layer 125 and around gate 160 (and gate dielectric 170) (FIG. 5). It is noted that opening 135 is asymmetrical because gate 160 (and gate dielectric 170) is not directly in the center of opening 135.

Turning now to FIGS. 6A-6B, asymmetric LDD region 115 may be formed within semiconductor substrate 105 by a first angled ion implant 145 (FIG. 6A) and a second angled ion implant 155 (FIG. 6B). As mentioned above, first angled ion implant 145 and second angled ion implant 155 may be either N-type or P-type, depending on whether a NFET process flow is required or a PFET process flow is required.

Next, photoresist layer 125 is removed and a second photoresist layer 163 is formed over semiconductor substrate 105 (not shown). As seen in FIG. 7, an opening 171 is formed on a first side 151 of gate 160 in order to form first source drain region 110 within semiconductor substrate 105. First source drain region 110 is formed by a first vertical ion implant 165. As mentioned above, first vertical ion implant 165 may be either N-type or P-type. However, first vertical ion implant 165 will be appropriate in order to have first source drain region 110 doped the same as asymmetric LDD region 115.

Figure 8:
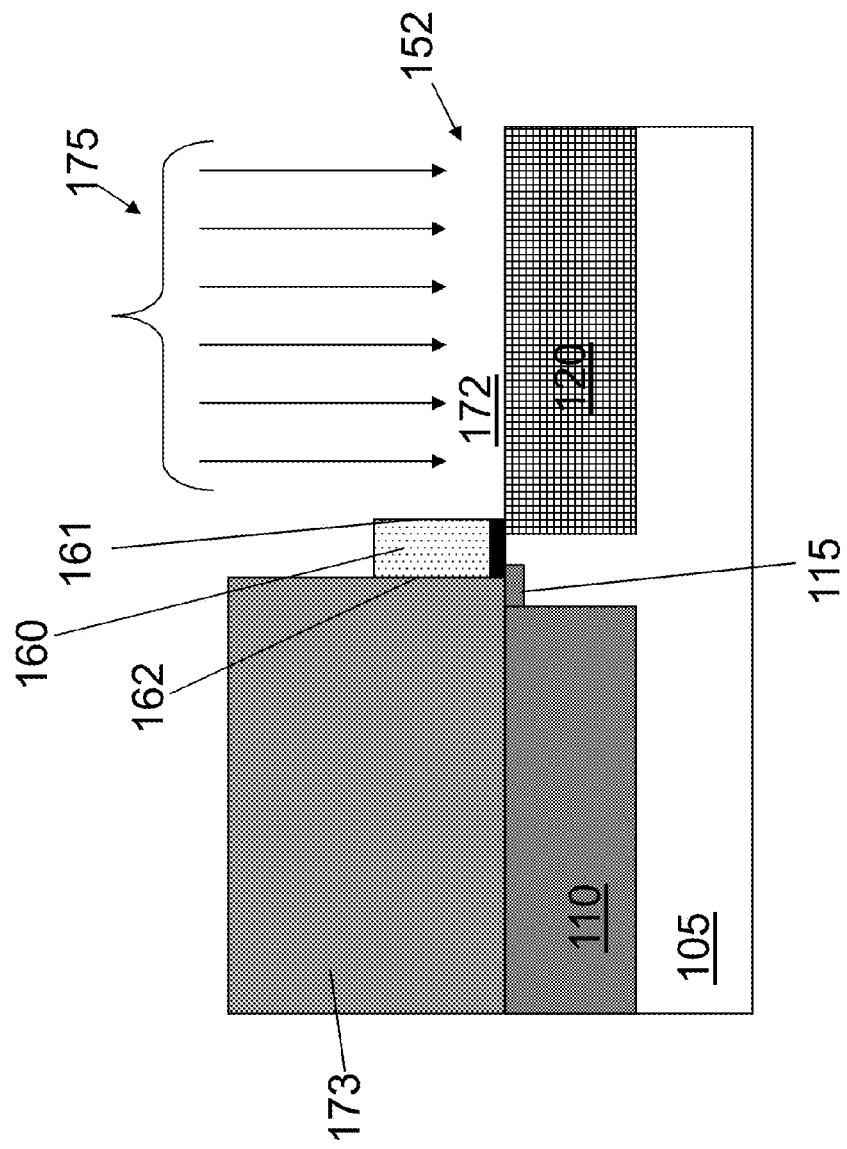

Second photoresist layer 163 is then removed and third photoresist layer 173 is formed over semiconductor substrate 105 (not shown). As seen in FIG. 8, an opening 172 is formed on a second side 152 of gate 160 in order to form second source drain region 120 within semiconductor substrate 105. Second source drain region 120 is formed by a second vertical ion implant 175. As mentioned above, second vertical ion implant 175 may be either N-type or P-type. However, second vertical ion implant 175 will be appropriate to be the reverse doping of asymmetric LDD region 115 and first source drain region 110.

As seen in FIG. 8, asymmetric LDD region 115 extends from first source drain region 110 into intrinsic region 150 between first source drain region 110 and second source drain region 120. Asymmetric LDD region 115 also may not extend to second source drain region 120, such that intrinsic region 150 is between asymmetric LDD region 115 and second source drain region 120. A gate 160 may be positioned atop semiconductor substrate 105. Further, first outer edge 161 of gate 160 overlaps second source drain region 120. Second outer edge 162 of gate 160 does not overlap first source drain region 110. Second outer edge 162 of gate 160 may overlap asymmetric LDD region 115.

Figure 9:
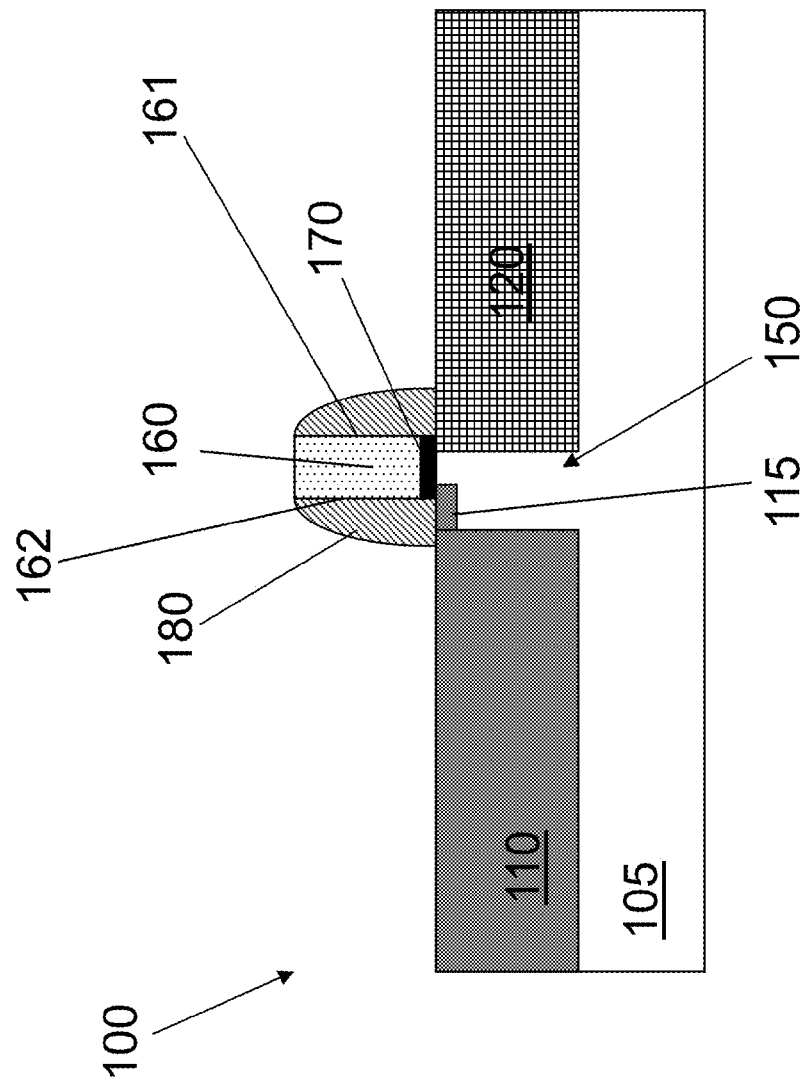

Turning now to FIG. 9, forming semiconductor structure 100 may further include forming spacer structures 180 on either side of gate 160. Spacer structures 180 may comprise any commonly used spacer material including but not limited to silicon oxide, nitride.

Figure 10:
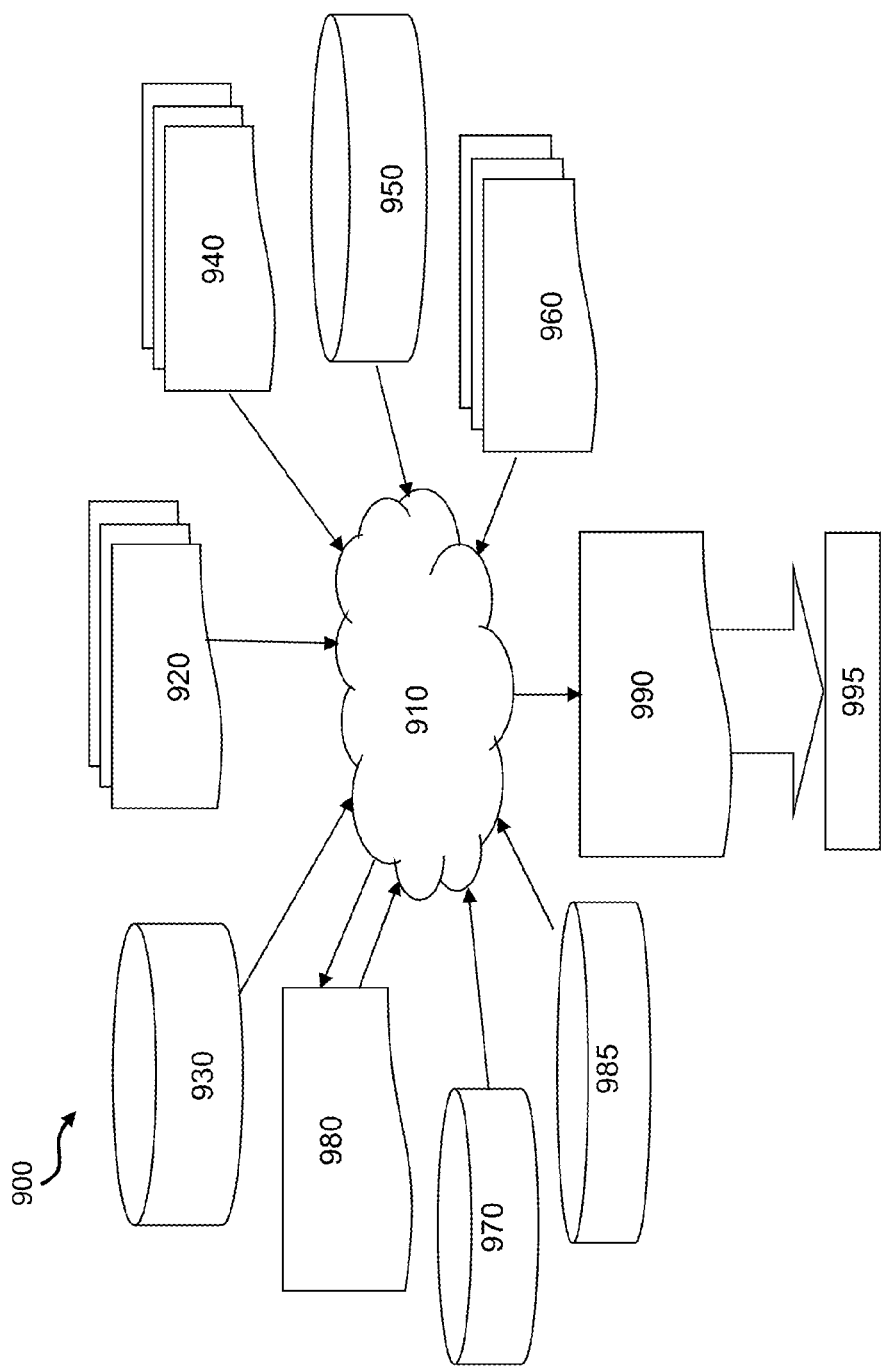
FIG. 10 is a flow diagram of a design process used in semiconductor design, manufacture, and/or test.

FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device comprising:
   a semiconductor substrate including a first source drain region, a second source drain region, and an intrinsic region therebetween;
   an asymmetric lightly doped drain (LDD) region within the substrate, wherein the asymmetric LDD region extends from the first source drain region into the intrinsic region between the first source drain region and the second source drain region,
   wherein the first source drain region is N-doped, the second source drain region is P-doped, and the asymmetric LDD region is N-doped; and
   a gate positioned atop the semiconductor substrate, wherein an outer edge of the gate overlaps the second source drain region.

2. The semiconductor device of claim 1, wherein the asymmetric LDD region does not extend into the second source drain region.

3. The semiconductor device of claim 1, wherein a second outer edge of the gate overlaps the asymmetric LDD region.

4. The semiconductor device of claim 1, further comprising a spacer structure on either side of the gate.

5. The semiconductor device of claim 1, further comprising a gate dielectric between the semiconductor substrate and the gate.

6. A semiconductor device comprising:
   a semiconductor substrate including a first source drain region, a second source drain region, and an intrinsic region therebetween;
   an asymmetric lightly doped drain (LDD) region within the substrate, wherein the asymmetric LDD region extends from the first source drain region into the intrinsic region between the first source drain region and the second source drain region,
   wherein the first source drain region is P-doped, the second source drain region is N-doped, and the asymmetric LDD region is P-doped; and
   a gate positioned atop the semiconductor substrate, wherein an outer edge of the gate overlaps the second source drain region.

7. The semiconductor device of claim 6, wherein the asymmetric LDD region does not extend into the second source drain region.

8. The semiconductor device of claim 6, wherein a second outer edge of the gate overlaps the asymmetric LDD region.

9. The semiconductor device of claim 6, further comprising a spacer structure on either side of the gate.

10. The semiconductor device of claim 6, further comprising a gate dielectric between the semiconductor substrate and the gate.

* * * * *